US011291088B2

(12) United States Patent
Tomomura (10) Patent No.: US 11,291,088 B2
(45) Date of Patent: Mar. 29, 2022

(54) HIGH-FREQUENCY HEATING DEVICE (71) Applicant: SHARP KABUSHIKI KAISHA, Osaka (JP)

(72) Inventor: Yoshinobu Tomomura, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 333 days.

(21) Appl. No.: 16/080,285

(22) PCT Filed: Jan. 17, 2017

(86) PCT No.: PCT/JP2017/001320
§ 371 (c)(1),
(2) Date: Aug. 27, 2018

(87) PCT Pub. No.: WO2018/003152
PCT Pub. Date: Jan. 4, 2018

(65) Prior Publication Data
US 2019/0075625 A1 Mar. 7, 2019

(30) Foreign Application Priority Data
Jun. 27, 2016 (JP) .............................. JP2016-126339

(51) Int. Cl.
*H05B 6/68* (2006.01)
*H05B 6/66* (2006.01)
(Continued)

(52) U.S. Cl.
CPC ........ *H05B 6/686* (2013.01); *H02M 3/33507* (2013.01); *H03F 3/189* (2013.01);
(Continued)

(58) Field of Classification Search
CPC .......... H02M 3/33507; H03F 2200/411; H03F 2200/451; H03F 3/189; H03F 3/19;
(Continued)

(56) References Cited

U.S. PATENT DOCUMENTS 3,735,237 A * 5/1973 Derby .................... H05B 6/666
363/8
3,840,810 A * 10/1974 Fritts .................. G01R 31/2848
324/764.01
(Continued)

FOREIGN PATENT DOCUMENTS

JP S63-184280 A 7/1988
JP 2007-266013 A 10/2007
(Continued)

OTHER PUBLICATIONS

Traanslation JP2007329021 (Year: 2020).*
Translation JP 2008060017 (Year: 2020).*

*Primary Examiner* — Ibrahime A Abraham
*Assistant Examiner* — Frederick F Calvetti
(74) *Attorney, Agent, or Firm* — ScienBiziP, P.C.

(57) ABSTRACT

A microwave heating cooker (1) includes a high-frequency power source (10). The high-frequency power source (10) includes a first semiconductor amplification circuit (amplifier) (3), a second semiconductor amplification circuit (amplifier) (4), an antenna (power supply unit) (5), a high-frequency generation unit (6), a commercial power source (alternating current power source) (7), a first full-wave rectification circuit (11), and a switching converter (12). The high-frequency generation unit (6) is configured from a commercial transformer (20), a second full-wave rectification circuit (21), resistors (22 and 23), an amplifier (24), an analog multiplier (amplitude modulation unit) (25), and a high-frequency oscillator (oscillator) (26), among others. The analog multiplier (25) modulates the amplitude of the output voltage from the high-frequency oscillator (26) with a signal wave that is in synchronism with a half-period of the cycle of the commercial power source (7).

9 Claims, 8 Drawing Sheets (51) Int. Cl.
  *H03F 3/24*   (2006.01)
  *H03F 3/19*   (2006.01)
  *H02M 3/335*  (2006.01)
  *H03F 3/189*  (2006.01)
  *H03F 3/20*   (2006.01)

(52) U.S. Cl.
  CPC ............. *H03F 3/19* (2013.01); *H03F 3/245* (2013.01); *H05B 6/66* (2013.01); *H05B 6/687* (2013.01); *H03F 3/20* (2013.01); *H03F 2200/411* (2013.01); *H03F 2200/451* (2013.01); *Y02B 40/00* (2013.01)

(58) Field of Classification Search
  CPC .. H03F 3/20; H03F 3/245; H05B 6/66; H05B 6/686; H05B 6/687; Y02B 40/143
  USPC ................. 219/715–718, 760, 761
  See application file for complete search history.

(56) References Cited

U.S. PATENT DOCUMENTS

| | | | | |
|---|---|---|---|---|
| 4,365,111 A * | 12/1982 | Joel, Jr. | ............... | H04K 1/02 380/41 |
| 4,396,801 A * | 8/1983 | Edson | ............... | H04J 3/042 370/345 |
| 4,420,668 A * | 12/1983 | Larson | ............... | H05B 6/687 219/718 |
| 4,734,553 A * | 3/1988 | Noda | ............... | H05B 6/6455 219/711 |
| 4,904,837 A * | 2/1990 | Low | ............... | H05B 6/685 219/717 |
| 5,091,617 A | 2/1992 | Maehara et al. | | |
| 5,115,168 A * | 5/1992 | Shoda | ............... | H01J 65/044 315/223 |
| 5,276,300 A * | 1/1994 | Low | ............... | H05B 6/80 219/717 |
| 5,347,109 A * | 9/1994 | Nakabayashi | ............... | H05B 6/685 219/716 |
| 5,548,103 A * | 8/1996 | Morita | ............... | H05B 6/6458 219/703 |
| 5,977,530 A * | 11/1999 | Bessho | ............... | H02M 3/33569 219/715 |
| 6,433,641 B1* | 8/2002 | Sakuno | ............... | H03F 1/0261 330/149 |
| 6,806,774 B2* | 10/2004 | Sakuno | ............... | H03F 1/0261 330/285 |
| 7,787,779 B2* | 8/2010 | Weiner | ............... | G02F 2/002 398/201 |
| 8,324,541 B2* | 12/2012 | Shirakawa | ............... | H05B 6/666 219/721 |
| 9,357,591 B2* | 5/2016 | Moriya | ............... | H05B 6/681 |
| 9,609,698 B2* | 3/2017 | Mihara | ............... | H05B 6/76 |
| 10,622,964 B2* | 4/2020 | Kawasaki | ............... | H03H 9/02944 |
| 2002/0167358 A1* | 11/2002 | Sakuno | ............... | H03F 1/565 330/296 |
| 2005/0013148 A1* | 1/2005 | Kunow | ............... | H02M 3/1584 363/65 |
| 2009/0001074 A1* | 1/2009 | Shirakawa | ............... | H05B 6/683 219/721 |
| 2012/0020119 A1* | 1/2012 | Tang | ............... | H02M 1/425 363/21.02 |
| 2014/0361009 A1* | 12/2014 | Mihara | ............... | H05B 6/76 219/715 |
| 2018/0041167 A1* | 2/2018 | Belkin | ............... | H03D 7/1408 |
| 2019/0075625 A1* | 3/2019 | Tomomura | ............... | H03F 3/245 |

FOREIGN PATENT DOCUMENTS

| | | |
|---|---|---|
| JP | 2007-329021 A | 12/2007 |
| JP | 2008-060017 A | 3/2008 |

* cited by examiner

HIGH-FREQUENCY HEATING DEVICE

TECHNICAL FIELD

The present invention relates to a high-frequency heating device that operates to process food and other objects by applying a high-frequency electric field, such as in heating and thawing.

BACKGROUND ART

A microwave heating cooker (high-frequency heating device) is a device that heats a dielectric object to be heated by means of high-frequency dielectric heating using a semiconductor device. Such a high-frequency heating device is configured to include multiple stages of high-frequency power amplification circuits that amplify the power of the output of a high-frequency oscillator, and an antenna that radiates the power into a cooking chamber in the form of a microwave.

The high-frequency power amplification circuit is basically intended for use in such applications as wireless communications. Accordingly, a DC voltage is supplied to the high-frequency power amplification circuit for stable high-frequency output. Because the commercial power source supplies power in the form of alternating current, it is desired to convert the power into DC voltage when supplying voltage to the power supply of the high-frequency power amplification circuit, taking into consideration the power factor. For example, PTL 1 proposes a configuration for relatively large-power-capacity devices using microwave, whereby a commercial AC voltage is converted into a low-pulsating DC voltage, and supplied to a power supply circuit while improving the power factor of the input voltage with a power factor improving circuit (PFC). The PFC is configured from a large-capacity electrolytic capacitor.

PTL 2 discloses a device using microwave in which a voltage produced by nonsmooth rectification of a voltage from a commercial power source is supplied to a high-frequency power amplification circuit to simplify the circuit. Specifically, the device using microwave described in PTL 2 includes a power supply means 4 that activates the smooth voltage produced by full-wave rectification of a voltage from a commercial power source 1.

CITATION LIST

Patent Literature

PTL 1: JP-A-2008-60017
PTL 2: JP-A-2007-329021

SUMMARY OF INVENTION

Technical Problem

Some varieties of commercially available microwave heating cookers are equipped with extra cooking functions that incorporate, for example, infrared rays, heated air, and superheated steam with a heater, in addition to the microwave heating function. Such heater-equipped microwave heating cookers involve a large temperature increase inside the cooking cabinet during use.

The PFC configured from a large-capacity electrolytic capacitor described in PTL 1 does not withstand such a high-temperature environment. Adding heater functionality to a microwave heating cooker provided with a large-capacity electrolytic capacitor may therefore lead to a shorter capacitor life, and, in turn, a shorter product life. Installing a large-capacity electrolytic capacitor also increases the circuit structure, and manufacturing cost.

The device using microwave described in PTL 2 smoothes the commercial power source to certain extents without using an electrolytic capacitor. However, the device using microwave described in PTL 2 does not take into account improving the input power factor.

It is accordingly an object of the present invention to provide a high-frequency heating device with which the input power factor of an alternating current power source can be improved without using a large-capacity electrolytic capacitor.

Solution to Problem

According to an aspect of the present invention, there is provided a high-frequency heating device that includes:
an alternating current power source that supplies power;
an oscillator that generates a high-frequency signal;
an amplitude modulation unit that modulates an amplitude of the high-frequency signal with a signal wave that is in synchronism with a half-period of a cycle of the alternating current power source;
an amplifier that amplifies the high-frequency signal modulated in amplitude by the amplitude modulation unit; and
a power supply unit by which high-frequency power obtained from the high-frequency signal amplified by the amplifier is supplied to an object to be heated.

The high-frequency heating device may be such that the signal wave that is in synchronism with the half-period of the cycle of the alternating current power source has a waveform produced by full-wave rectification of a voltage of the alternating current power source.

The high-frequency heating device may be such that the high-frequency power has a frequency in a UHF band, and the power supply unit has an antenna that radiates the high-frequency power against the object to be heated. Here, the UHF band refers to a frequency band between 0.3 GHz and 3 GHz.

The high-frequency heating device may be such that the high-frequency power has a frequency in an HF band or in a VHF band, and the power supply unit has at least two electrodes, and the object to be heated is placed between said at least two electrodes, and that the high-frequency power forms a high-frequency electric field between said at least two electrodes. Here, the HF band refers to a frequency band between 3 MHz and 30 MHz. The VHF band refers to a frequency band between 30 MHz and 300 MHz.

The high-frequency heating device may further include a first rectification circuit connected to the alternating current power source, and that rectifies a current supplied to a power supply terminal of the amplifier; and a second rectification circuit connected to the alternating current power source via a power converter. The signal wave that is in synchronism with the half-period of the cycle of the alternating current power source may be generated by the second rectification circuit.

The high-frequency heating device may further include a rectification circuit and a switching converter between the alternating current power source and the amplifier. The switching converter may have a transformer, and an auxiliary coil provided for the transformer. The signal wave that is in synchronism with the half-period of the cycle of the alternating current power source may be obtained from the auxiliary coil.

Advantageous Effects of Invention

As stated above, the high-frequency heating device according to the aspect of the present invention includes an amplitude modulation unit that modulates the amplitude of a high-frequency signal with a signal wave that is in synchronism with a half-period of the cycle of an alternating current power source. In this way, the input power factor of the alternating current power source can be improved without using a large-capacity electrolytic capacitor.

DESCRIPTION OF EMBODIMENTS

Embodiments of the present invention are described below with reference to the accompanying drawings. In the following descriptions, like elements are given like reference numerals. Such like elements will be referred to by the same names, and have the same functions. Accordingly, detailed descriptions of such elements will not be repeated.

First Embodiment

The present embodiment describes a high-frequency heating device of an aspect of the present invention, taking a microwave heating cooker as an example. The microwave heating cooker heats an object to be heated such as food using electromagnetic waves of a 2.4 GHz to 2.5 GHz frequency in the UHF band. It is to be noted that the electromagnetic waves used in a high-frequency heating device of an aspect of the present invention are not limited to these frequencies.

Schematic Structure of Microwave Heating Cooker (High-Frequency Heating Device)

Figure 1:
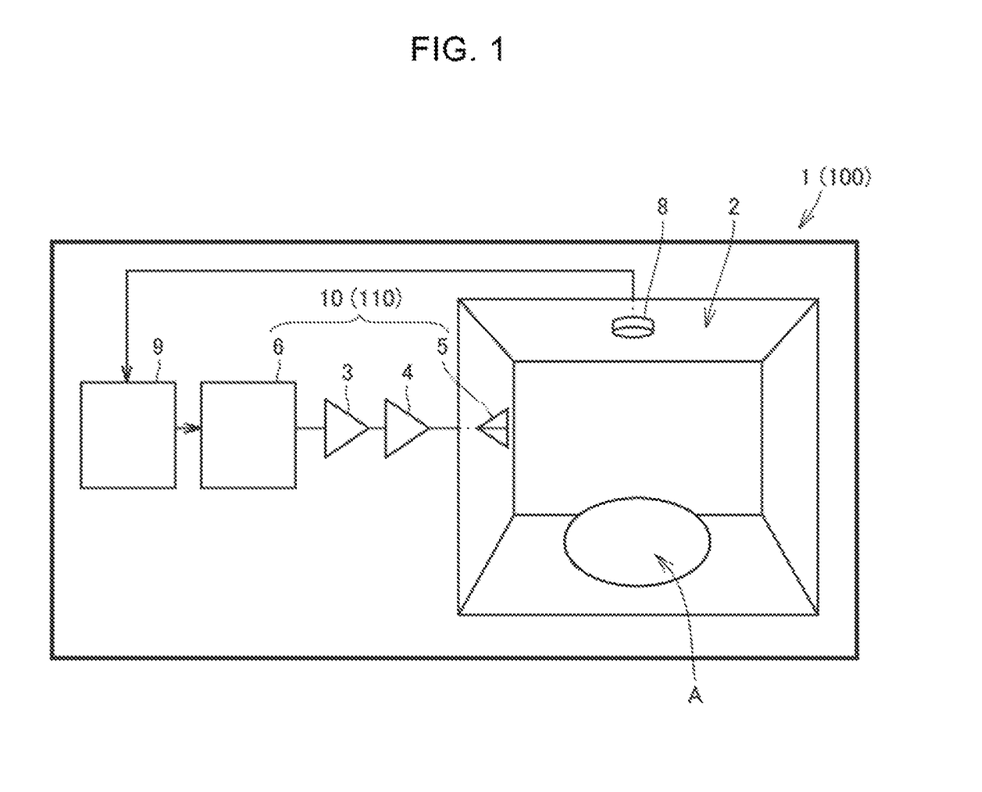
FIG. 1 is a schematic view showing an inner configuration of a microwave heating cooker according to First Embodiment of the present invention.

A schematic structure of a microwave heating cooker (high-frequency heating device) 1 according to the present embodiment is described first, with reference to FIG. 1. The microwave heating cooker 1 processes (e.g., heating, thawing) an object A to be heated such as food with electromagnetic wave radiation of high-frequency power. As shown in FIG. 1, the main constituting members of the microwave heating cooker 1 include a cooking chamber 2, a first semiconductor amplification circuit (amplifier) 3, a second semiconductor amplification circuit (amplifier) 4, an antenna (power supply unit) 5, a high-frequency generation unit 6, a temperature sensor 8, and a control unit 9. The first semiconductor amplification circuit 3, the second semiconductor amplification circuit 4, the antenna 5, and the high-frequency generation unit 6 constitute a high-frequency power source 10.

The cooking chamber 2 is formed as a metallic casing. An object A to be heated such as food is placed in the cooking chamber 2. The antenna 5 of the high-frequency power source 10 (described later) radiates high-frequency electromagnetic waves, and heats the object A to be heated inside the cooking chamber 2.

The first semiconductor amplification circuit 3, the second semiconductor amplification circuit 4, the antenna 5, and the high-frequency generation unit 6 constitute the high-frequency power source 10. Specifically, the high-frequency generation unit 6 modulates the oscillating frequency of a high-frequency signal to a 2.4 GHz to 2.5 GHz frequency suited for the size and the properties of the object A to be heated. The first semiconductor amplification circuit 3 and the second semiconductor amplification circuit 4 amplify the high-frequency signal sent from the high-frequency generation unit 6. The high-frequency power of the high-frequency signal amplified by the amplification circuits radiates into the cooking chamber 2 through the antenna 5.

The temperature sensor 8 is disposed, for example, on the ceiling of the cooking chamber 2. The temperature sensor 8 monitors the temperature of the object A to be heated. The control unit 9 is connected to the constituting components of the microwave heating cooker 1, and controls these members. Examples of the control by the control unit 9 include adjusting the high-frequency power supplied from the high-frequency generation unit 6, and ending heating, using the temperature information monitored by the temperature sensor 8.

Configuration of High-Frequency Power Source

Figure 2:
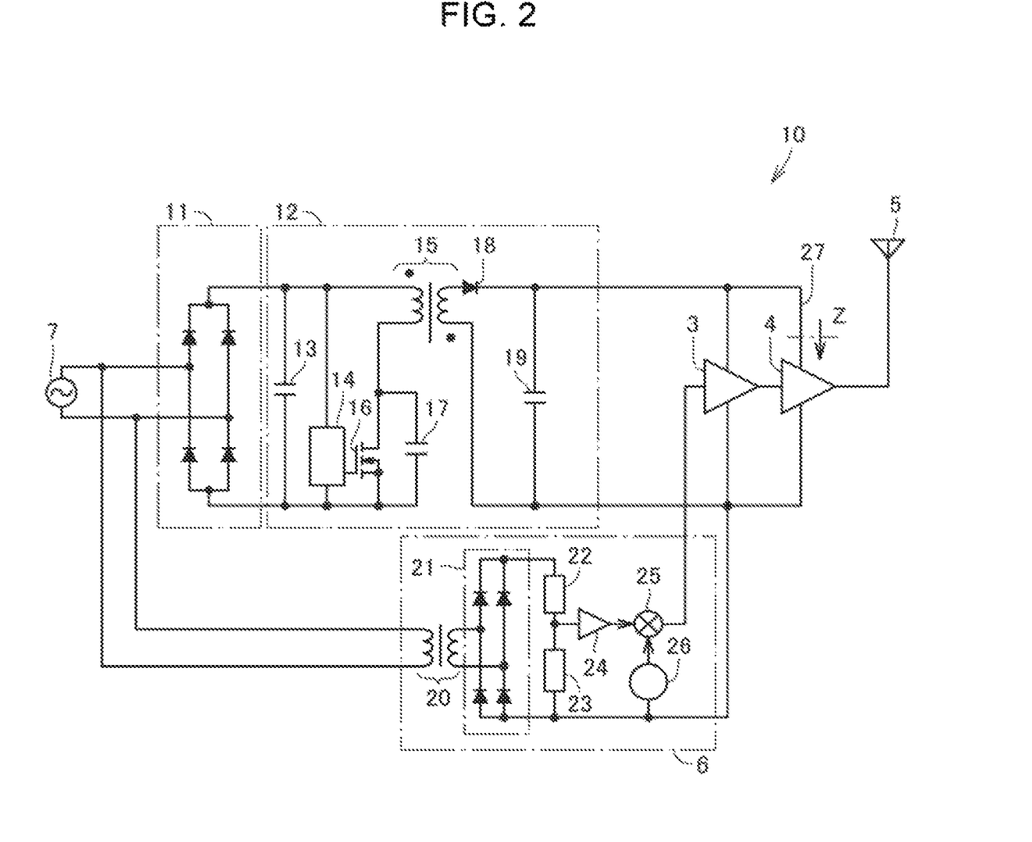
FIG. 2 is a circuit diagram showing a circuit structure of a high-frequency power source of the microwave heating cooker shown in FIG. 1.

The following describes the configuration inside the high-frequency power source 10 of the microwave heating cooker 1, with reference to FIG. 2. FIG. 2 shows a circuit structure of the high-frequency power source 10. The main constituting members of the high-frequency power source 10 include the first semiconductor amplification circuit 3, the second semiconductor amplification circuit 4, the antenna 5, the high-frequency generation unit 6, a commercial power source (alternating current power source) 7, a first full-wave rectification circuit 11, and a switching converter 12.

The commercial power source 7 supplies alternating current power. The first full-wave rectification circuit (first rectification circuit) 11 rectifies the single-phase AC voltage from the commercial power source 7, and supplies the power to the switching converter 12.

The switching converter 12 is a flyback converter, and controls power so that the current of the commercial power source 7 (see FIG. 3(b)) follows the voltage of the commercial power source 7 (see FIG. 3(a)). This is to improve the input power factor of the commercial power source 7. Aside from a flyback converter, for example, a DC-DC converter may be used as the switching converter 12.

The switching converter 12 is configured from a primary smoothing capacitor 13, a power supply controller 14, a transformer (power converter) 15, an FET (field-effect transistor) 16, and a snubber capacitor 17, among others. The switching converter 12 also includes a diode 18 and a secondary smoothing capacitor 19 on the secondary side of the transformer (power converter) 15. The primary smoothing capacitor 13 and the secondary smoothing capacitor 19 absorb a switching frequency component.

In an aspect of the present invention, a capacitor of a relatively small capacity, such as a film capacitor is used as the secondary smoothing capacitor 19, instead of using a large-capacity electrolytic capacitor. In this way, the heat resistance of the high-frequency power source 10 can improve. The product life can also increase as compared to when a large-capacity electrolytic capacitor is used.

The switching converter 12 is connected to the first semiconductor amplification circuit 3, the second semiconductor amplification circuit 4, and the antenna 5 of the following stage.

The switching converter 12 controls ON/OFF of the FET 16 with the power supply controller 14 so that the current of the commercial power source 7 follows the voltage of the commercial power source 7. In this way, the input power factor of the commercial power source 7 can improve.

In the microwave heating cooker 1 of the present embodiment, a capacitor of a relatively small capacity, such as a film capacitor, is used as the secondary smoothing capacitor 19. The secondary smoothing capacitor 19 has a smaller power storage capacity than other types of capacitors, such as a large-capacity electrolytic capacitor. Accordingly, while the switching converter 12 is capable of smoothing the output voltage to certain extents, the switching converter 12, unlike the device using microwave disclosed in, for example, PTL 1, cannot fully convert the output voltage into a DC voltage. That is, the amplitude is not constant in the power supplied to the first semiconductor amplification circuit 3 and the second semiconductor amplification circuit 4 on the following stage of the switching converter 12.

For this reason, the microwave heating cooker 1 of the present embodiment is configured to modulate the amplitude of the high-frequency output signal from the high-frequency generation unit 6. In this way, the power consumption in the first semiconductor amplification circuit 3 and the second semiconductor amplification circuit 4 can follow the power sent to the secondary side of the switching converter 12, and supplied to the first semiconductor amplification circuit 3 and the second semiconductor amplification circuit 4 of the following stage.

Configuration of High-Frequency Generation Unit

The high-frequency generation unit 6 has a high-frequency oscillator (oscillator) 26 that generates a high-frequency signal. The high-frequency output signal from the high-frequency generation unit 6 is amplified in the first semiconductor amplification circuit 3 and the second semiconductor amplification circuit 4.

The high-frequency generation unit 6 is configured from a commercial transformer (power converter) 20, a second full-wave rectification circuit (second rectification circuit) 21, resistors 22 and 23, an amplifier 24, an analog multiplier (amplitude modulation unit) 25, and a high-frequency oscillator 26, among others.

The commercial transformer 20 transforms the input voltage (primary voltage) from the commercial power source 7, and outputs a secondary voltage similar in waveform to the input voltage. The second full-wave rectification circuit 21 is connected to the secondary side of the commercial transformer 20. In the second full-wave rectification circuit 21, the single-phase AC voltage on the secondary side of the commercial transformer 20 is rectified, as with the case of the first full-wave rectification circuit 11. The resistors 22 and 23 divide the output voltage of the second full-wave rectification circuit 21.

Figure 3:
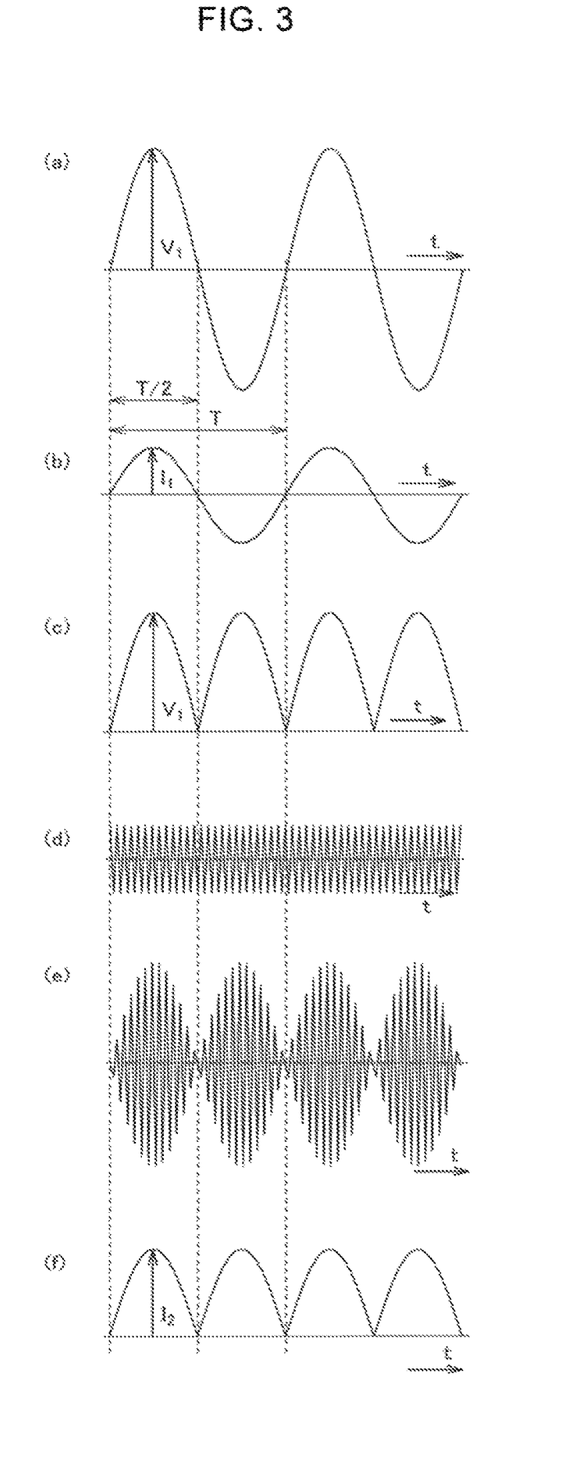
FIG. 3(a) is a waveform chart representing a waveform of an input voltage (60 Hz) of a commercial power source (alternating current power source) of the microwave heating cooker shown in FIG. 1.
FIG. 3(b) is a waveform chart representing a waveform of an input current (60 Hz) of the commercial power source (alternating current power source) of the microwave heating cooker shown in FIG. 1.
FIG. 3(c) is a waveform chart representing a waveform of a primary voltage of a switching converter of the microwave heating cooker shown in FIG. 1.
FIG. 3(d) is a waveform chart representing a waveform (before amplitude modulation) of an output high-frequency voltage from a high-frequency oscillator of the microwave heating cooker shown in FIG. 1.
FIG. 3(e) is a waveform chart representing a waveform of a high-frequency voltage after amplitude modulation of the high-frequency voltage of FIG. 3(d).
FIG. 3(f) is a waveform chart representing a waveform of a current passing through a power supply terminal of a semiconductor amplification circuit of the microwave heating cooker shown in FIG. 1.

The waveform of the voltage divided by the resistors 22 and 23 is similar to the waveform produced by full-wave rectification of the voltage from the commercial power source 7 (a waveform rectified by the first full-wave rectification circuit 11; see FIG. 3, (c)). The signal wave rectified by the second full-wave rectification circuit 21, and divided by the resistors 22 and 23 is a signal wave that is in synchronism with a half-period of the cycle of the commercial power source 7.

The amplifier 24 amplifies the signal wave. The signal wave of a level adjusted by the amplifier 24 is input to the analog multiplier 25.

The high-frequency oscillator 26 generates an unmodulated voltage of, for example a 2.4 GHz to 2.5 GHz frequency (for example, 2.45 GHz) (see FIG. 3, (d)). The output voltage from the high-frequency oscillator 26 is input to the analog multiplier 25. The analog multiplier 25 modulates the amplitude of the 2.45-GHz unmodulated voltage with the signal output from the amplifier 24 and having a waveform produced by full-wave rectification of the voltage from the commercial power source 7 (a signal wave that is in synchronism with a half-period T/2 of the cycle T of the commercial power source 7) (see FIG. 3, (c)). FIG. 3, (e) shows a waveform of a high-frequency signal modulated in amplitude by the analog multiplier 25.

Power Control Method in High-Frequency Power Source

The following describes a method for controlling the output high-frequency power of the high-frequency power source 10.

The current that flows into the switching converter 12 from the commercial power source 7 (see FIG. 3, (b)) has an improved power factor, and is similar in shape to the voltage of the commercial power source 7 (see FIG. 3, (a)). Accordingly, the instantaneous value $P_1$ of the primary input power of the transformer 15 can be represented by the following formula (1).

$$P_1 = V_1 \cdot I_1 \cdot \sin^2(2\pi ft) \qquad \text{Formula (1)}$$

In the formula (1), $V_1$ is the peak value of the voltage of the commercial power source 7, $I_1$ is the peak value of the current of the commercial power source 7, f is the frequency of the commercial power source 7, and t is the elapsed time. As a rule, $V_1$ cannot be changed by controlling the switching converter 12. Accordingly, the peak value $I_1$ of current is adjusted by controlling ON/OFF of the FET 16, and the effective value of the primary power consumption $P_1$ is adjusted to the required value.

The following describes the power consumption $P_2$ in the first semiconductor amplification circuit 3 and the second semiconductor amplification circuit 4 on the secondary side of the transformer 15. The power consumption of the first semiconductor amplification circuit 3, and the bias current of the second semiconductor amplification circuit 4 are excluded from calculations because these are negligible. As described above, the high-frequency output signal from the antenna 5 of the high-frequency power source 10 is modulated in amplitude with a signal of a waveform produced by full-wave rectification of the voltage from the commercial power source 7.

The secondary power consumption $P_2$ can be represented by the following formula (2), using the current that flows through the power supply terminal 27 of the second semiconductor amplification circuit 4 (see FIG. 3, (f)), and the resistance value in terms of a resistance through the power supply terminal 27 of the second semiconductor amplification circuit 4.

$$P_2 = (I_2 \cdot |\sin(2\pi ft)|)^2 \cdot Z \quad \text{Formula (2)}$$
$$= I_2^2 \cdot Z \cdot \sin^2(2\pi ft)$$
$$= (G \cdot V_h)^2 \cdot Z \cdot \sin^2(2\pi ft)$$

In the formula (2), $I_2$ is the peak value of the current through the power supply terminal 27 of the second semiconductor amplification circuit 4, Z is the resistance value in terms of a resistance through the power supply terminal 27 of the second semiconductor amplification circuit 4, G is the gain of the second semiconductor amplification circuit 4, and $V_h$ is the peak value of the input full-wave rectified waveform to the analog multiplier 25.

By comparing formula (1) and formula (2), these formulae both contain the factor $\sin^2(2\pi ft)$. It can be seen from this that $P_2$ can follow $P_1$ when $I_1$ and $V_h$ are appropriately controlled.

If the secondary power consumption $P_2$ could follow the primary power consumption $P_1$, there would be a smaller need to store power on the secondary side. That is, it will not be necessary to convert the commercial AC voltage into DC voltage using a large-capacity electrolytic capacitor on the secondary side of a transformer as in the device using microwave described in PTL 1.

As described above, in the microwave heating cooker 1 of the present embodiment, the power consumption in the first semiconductor amplification circuit 3 and the second semiconductor amplification circuit 4 disposed on the following stage of the switching converter 12 can follow the power sent to the secondary side of the switching converter 12, while improving the input power factor of the commercial power source 7 on the primary side of the switching converter 12.

High-Frequency Power Source of Traditional High-Frequency Heating Device

Figure 7:
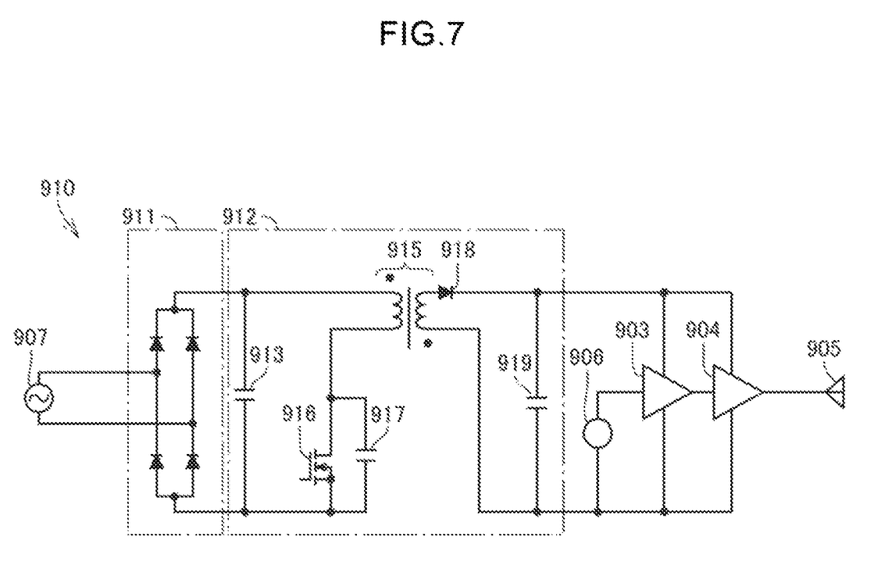
FIG. 7 is a circuit diagram showing a circuit structure of a high-frequency power source of a traditional high-frequency heating device.

For comparison, the following describes an example of a high-frequency power source of a traditional high-frequency heating device, specifically, the overall configuration of the high-frequency power source of the device using microwave disclosed in PTL 2. FIG. 7 shows a circuit structure of a high-frequency power source 910 of a traditional high-frequency heating device. The main constituting members of the high-frequency power source 910 include a first semiconductor amplification circuit 903, a second semiconductor amplification circuit 904, an antenna 905, a high-frequency oscillator 906, a commercial power source 907, a full-wave rectification circuit 911, and a switching converter 912.

The full-wave rectification circuit 911 has basically the same configuration as the first full-wave rectification circuit 11 of the high-frequency power source 10 of the present embodiment. The switching converter 912 is configured from a primary smoothing capacitor 913, a power supply controller (not illustrated), a transformer 915, an FET 916, a snubber capacitor 917, a diode 918, and a secondary electrolytic capacitor 919, among others. The switching converter 912 has basically the same configuration as the switching converter 912 of the high-frequency power source 10 of the present embodiment.

Figure 8:
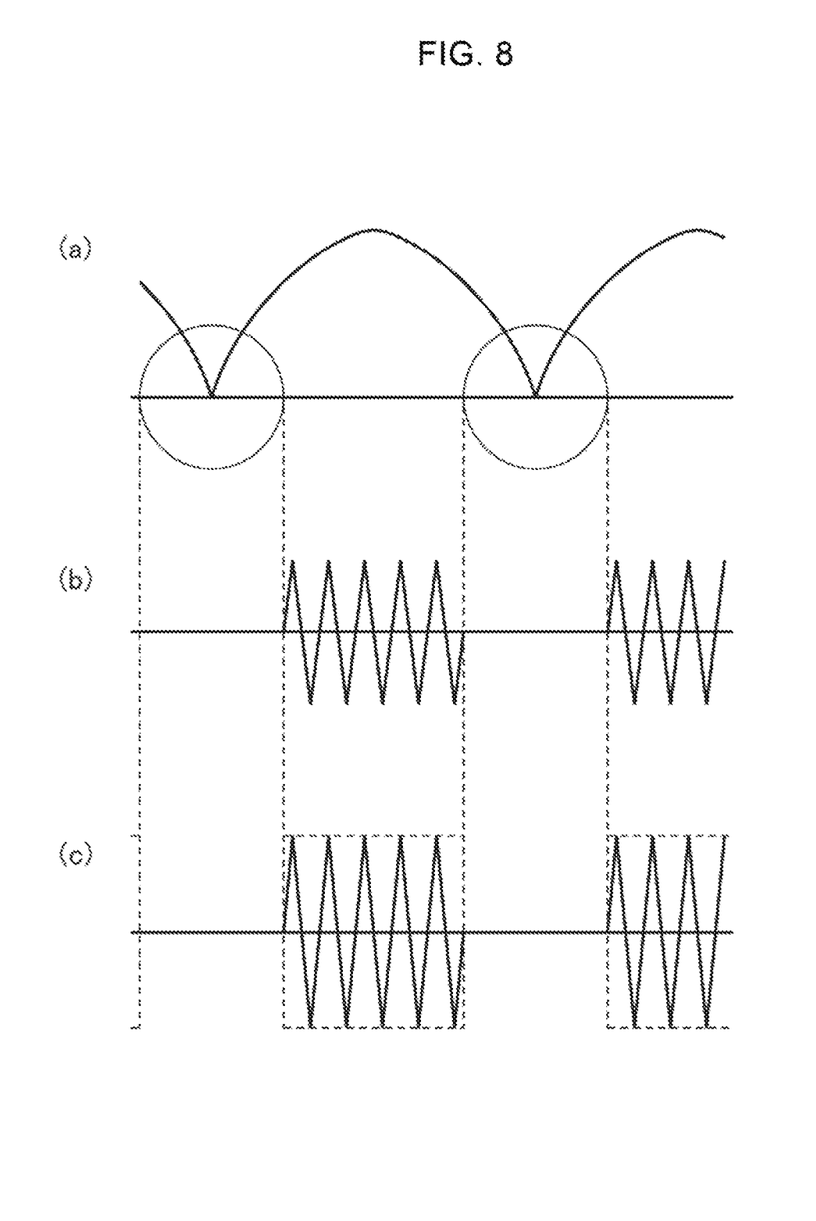
FIG. 8(a) is a waveform chart representing a waveform of a current passing through a power supply terminal of a semiconductor amplification circuit of the high-frequency heating device shown in FIG. 7.
FIG. 8(b) is a waveform chart representing a waveform of an output high-frequency voltage from a high-frequency oscillator of the high-frequency heating device shown in FIG. 7.
FIG. 8(c) is a waveform chart representing a waveform of an output high-frequency voltage from first and second semiconductor amplification circuits of the high-frequency heating device shown in FIG. 7.

The high-frequency oscillator 906 has a different configuration from that of the high-frequency generation unit 6 of the high-frequency power source 10 of the present embodiment. Specifically, the high-frequency oscillator 906 generates, for example, a 2.45-GHz unmodulated voltage. The unmodulated voltage is supplied to the first semiconductor amplification circuit 903 without amplitude modulation. FIG. 8 (*b*) shows a waveform of the unmodulated voltage supplied to the first semiconductor amplification circuit 903.

FIG. 8(*a*) shows a waveform of the voltage supplied to the second semiconductor amplification circuit 904. In the high-frequency power source 910, the power supplied from the commercial power source 907 is rectified full-wave by the full-wave rectification circuit 911, and supplied to the first semiconductor amplification circuit 903 and the second semiconductor amplification circuit 904 without being smoothed with the secondary electrolytic capacitor 919, which is a small-capacity film capacitor.

The amplitude of the voltage supplied to the second semiconductor amplification circuit 904 undergoes cycle fluctuations, as shown in the power waveform of FIG. 8(*a*). The output from the high-frequency oscillator 906 stops in a time period where the instantaneous voltage supplied to the second semiconductor amplification circuit 904 is low (circled regions in FIG. 8 (*a*)). In other time periods, no change occurs in the amplitude of the output voltage from the high-frequency oscillator 906 (see FIG. 8, (b)).

Accordingly, the envelope of the output power from the first semiconductor amplification circuit 903 and the second semiconductor amplification circuit 904 is not similar in shape to the full-wave rectified waveform, as shown in FIG. 8(*c*). It is accordingly not possible with the high-frequency power source 910 to improve the power factor of the commercial power source 907.

Advantages of High-Frequency Power Source of the Present Embodiment

In contrast, in the high-frequency power source 10 of the present embodiment, the high-frequency voltage is modulated in amplitude in the high-frequency generation unit 6, as described above. Specifically, the output unmodulated voltage from the high-frequency oscillator 26 (see FIG. 3, (*d*)) is modulated in amplitude with the signal output from the amplifier 24 and having a waveform produced by full-wave rectification of the voltage from the commercial power source 7 (see FIG. 3, (e)).

The waveform of the supplied voltage from the commercial power source 7 is rectified full-wave by the first full-wave rectification circuit 11. The secondary smoothing capacitor 19 (small-capacity film capacitor) immediately outputs the input power.

Accordingly, the waveform of the input power rectified by the first full-wave rectification circuit 11 and supplied to the second semiconductor amplification circuit 4 via the transformer 15 is similar in shape to the waveform of the amplitude-modulated high-frequency voltage output from the high-frequency generation unit 6. In this way, the input power factor of the commercial power source 7 (alternating current power source) can improve.

As described above, in the high-frequency power source 10 of the present embodiment, the need for maintaining power in the secondary smoothing capacitor 19 is small. This allows for use of a small-capacity capacitor, such as a film capacitor, as the secondary smoothing capacitor 19 in the microwave heating cooker 1 according to the present embodiment.

A small-capacity film capacitor is more resistant to high-temperature environment than a large-capacity electrolytic capacitor. The microwave heating cooker 1 produced with a small-capacity film capacitor can thus have a longer product life than a microwave heating cooker produced by using a large-capacity electrolytic capacitor.

A small-capacity film capacitor is also less expensive to produce than a large-capacity electrolytic capacitor. This gives a cost advantage to the microwave heating cooker 1 of the present embodiment.

Second Embodiment

Second Embodiment of the present invention is described below. Second Embodiment differs from First Embodiment in the configuration of the circuit (specifically, for example, the high-frequency generation unit 106) that generates a full-wave rectified waveform for modulating the amplitude of the high-frequency signal.

FIG. 1 shows a microwave heating cooker (high-frequency heating device) 100 according to Second Embodiment of the present invention. The basic configuration of the microwave heating cooker 100 is the same as that of the microwave heating cooker 1 according to First Embodiment (see FIG. 1). Accordingly, in the following descriptions of the microwave heating cooker 100, the same reference numerals will be used to refer to members having the same structures and the same functions as those described for the microwave heating cooker 1, and these will not be described.

Figure 4:
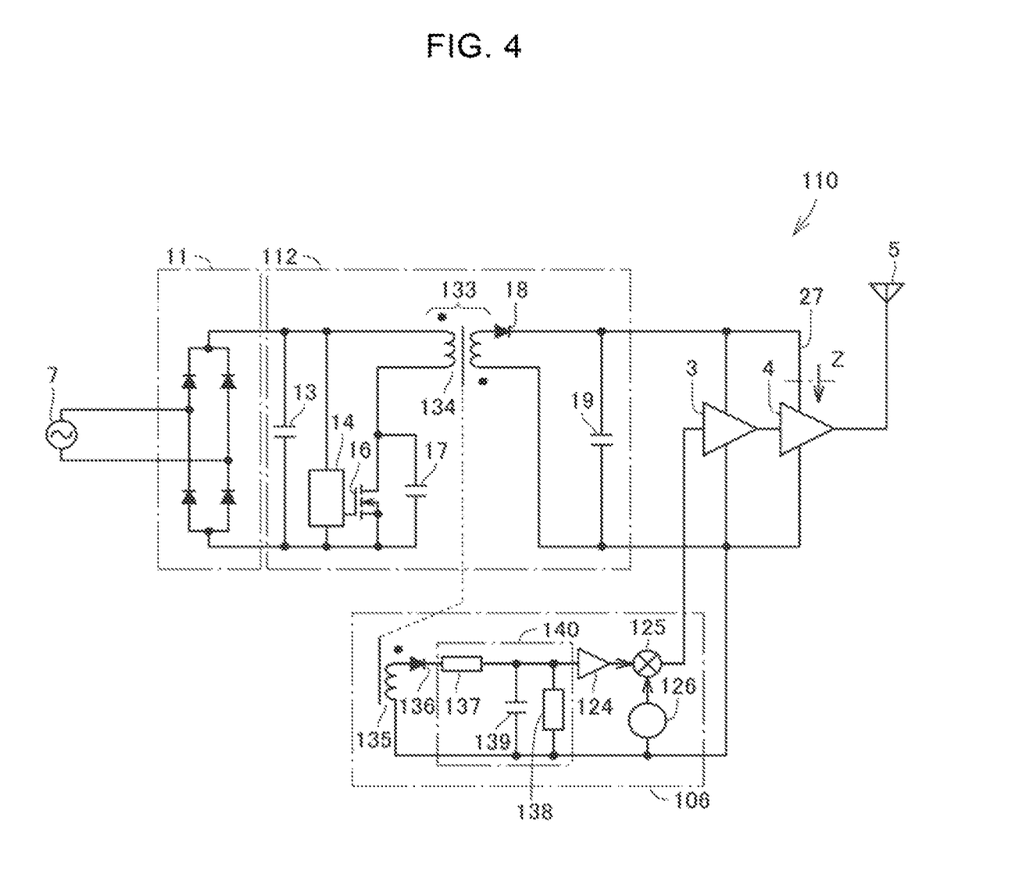
FIG. 4 is a circuit diagram showing a circuit structure of a high-frequency power source of a microwave heating cooker according to Second Embodiment of the present invention.

The microwave heating cooker 100 according to Second Embodiment includes a high-frequency power source 110. The high-frequency power source 110 has a different configuration from the high-frequency power source 10 of First Embodiment. FIG. 4 shows a circuit structure of the high-frequency power source 110. The main constituting members of the high-frequency power source 110 include a first semiconductor amplification circuit 3, a second semiconductor amplification circuit 4, an antenna 5, a high-frequency generation unit 106, a commercial power source (alternating current power source) 7, a full-wave rectification circuit (rectification circuit) 11, and a switching converter 112.

The first semiconductor amplification circuit 3, the second semiconductor amplification circuit 4, the antenna 5, commercial power source 7, and the full-wave rectification circuit 11 (corresponding to the first full-wave rectification circuit 11 of First Embodiment) may have the same configurations as those described in First Embodiment.

The switching converter 112 is a flyback converter, and controls power so that the current of the commercial power source 7 (see FIG. 3(b)) follows the voltage of the commercial power source 7 (see FIG. 3(a)). This is to improve the input power factor of the commercial power source 7.

The switching converter 112 is configured from a primary smoothing capacitor 13, a power supply controller 14, a transformer (power converter) 133, an FET (field-effect transistor) 16, and a snubber capacitor 17, among others. The switching converter 112 also includes a diode 18 and a secondary smoothing capacitor 19 on the secondary side of the transformer (power converter) 133.

In the high-frequency generation unit 6 in the high-frequency power source 10 of First Embodiment, the commercial transformer 20 is used to obtain an input voltage from the commercial power source 7. In contrast, in Second Embodiment, the transformer 133 is provided in the switching converter 112, instead of the commercial transformer 20. The transformer 133 is constructed from a primary coil 134 and an auxiliary coil 135.

The primary coil 134 may have the same configuration as the coil used for the transformer 15 of First Embodiment. The auxiliary coil 135 can provide primary voltage information that is proportional to the turn ratio of the primary coil 134 and the auxiliary coil 135, only while the FET 16 is ON.

The high-frequency generation unit 106 is configured from the auxiliary coil 135, a diode 136, a low-pass filter 140, an amplifier 124, an analog multiplier (amplitude modulation unit) 125, and a high-frequency oscillator 126, among others. The low-pass filter 140 is configured from a resistor 137, a resistor 138, and a capacitor 139, among others.

As mentioned above, the auxiliary coil 135 can provide the primary voltage information only while the FET 16 is ON. Accordingly, the diode 136 is provided in such an orientation that it becomes conducted only while the FET 16 is ON. The output voltage from the diode 136 is filtered through the low-pass filter 140 of the configuration above, and only a specific frequency component is input to the amplifier 124. The amplifier 124 amplifies the input voltage signal. The voltage signal of a level adjusted by the amplifier 124 is input to the analog multiplier 125.

According to the foregoing configuration, the input signal to the analog multiplier 125 is a signal of a waveform produced by full-wave rectification of the voltage from the commercial power source 7 (a signal wave that is in synchronism with a half-period of the cycle of the commercial power source 7).

The high-frequency oscillator 126 generates an unmodulated voltage in a frequency range of, for example, 2.4 GHz to 2.5 GHz (specifically, 2.45 GHz) (see FIG. 3, (d)). The output voltage from the high-frequency oscillator 126 is input to the analog multiplier 125. The analog multiplier 125 modulates the amplitude of the 2.45-GHz unmodulated voltage with the signal output from the amplifier 124 and having a waveform produced by full-wave rectification of the voltage from the commercial power source 7 (a signal wave that is in synchronism with a half-period T/2 of the cycle T of the commercial power source 7) (see FIG. 3, (c)).

FIG. 3, (e) shows a waveform of a high-frequency signal modulated in amplitude by the analog multiplier 125.

The output high-frequency power from the high-frequency power source 110 can be controlled by using the method of First Embodiment. That is, the method described in First Embodiment with reference to FIG. 3 and formulae (1) and (2) is also applicable to Second Embodiment.

With the foregoing configuration, in the high-frequency generation unit 106 of Second Embodiment, the amplitude modulation of the high-frequency signal can be achieved with a signal wave that is in synchronism with a half-period of the cycle of the commercial power source 7. Accordingly, in the microwave heating cooker 100 of the present embodiment, the power consumption in the amplification circuits 3 and 4 disposed in the following stage of the switching converter 112 can follow the power sent to the secondary side of the switching converter 112, while improving the input power factor of the commercial power source 7 on the primary side of the switching converter 112.

With the high-frequency generation unit 106 of Second Embodiment, the circuit structure can be made simpler than in First Embodiment.

Third Embodiment

Third Embodiment of the present invention is described below. The foregoing First and Second Embodiments described an example of a high-frequency heating device of an aspect of the present invention by taking a microwave heating cooker as an example. Third Embodiment describes a dielectric heating and thawing device as another example of a high-frequency heating device of an aspect of the present invention.

Figure 5:
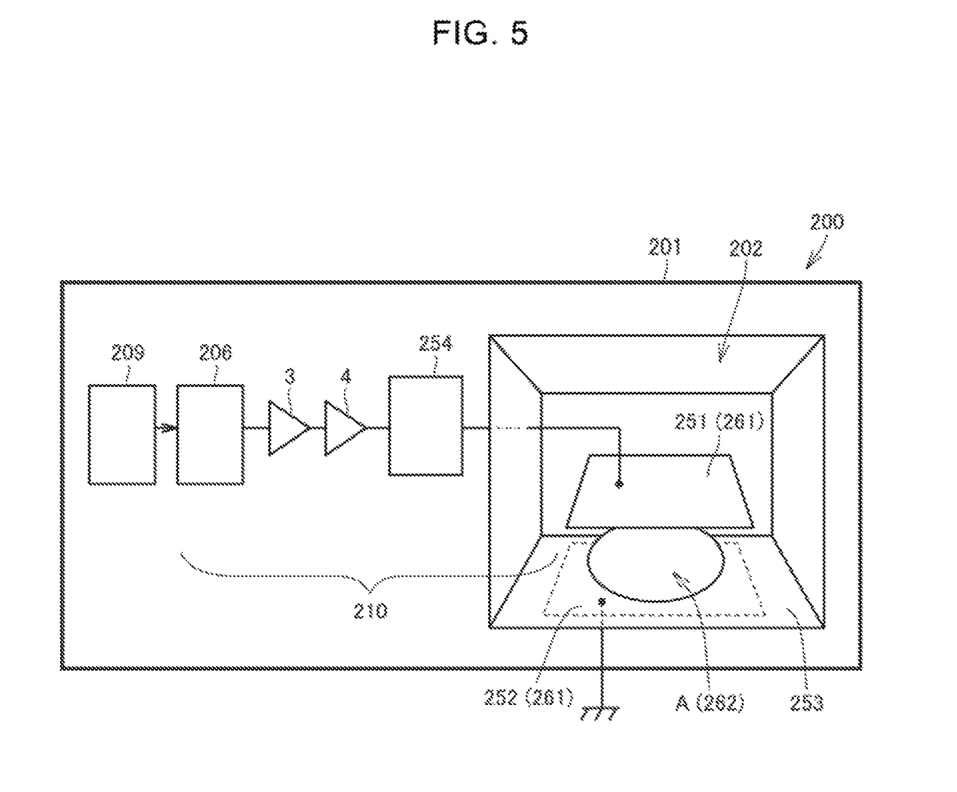
FIG. 5 is a schematic view showing an inner configuration of a dielectric heating and thawing device according to Third Embodiment of the present invention.

The dielectric heating and thawing device (high-frequency heating device) 200 according to the present embodiment heats and thaws an object to be heated such as food by using an electromagnetic wave of a frequency (specifically, 40.68 MHz) in the VHF band of 30 MHz to 300 MHz. However, the frequency of the electromagnetic wave used in the dielectric heating and thawing device of the present embodiment is not limited to this. The dielectric heating and thawing device of the present embodiment may use an electromagnetic wave of, for example, an HF band frequency (3 MHz to 30 MHz).

Schematic Structure of Dielectric Heating and Thawing Device (High-Frequency Heating Device)

A schematic structure of the dielectric heating and thawing device (high-frequency heating device) 200 according to the present embodiment is described first, with reference to FIG. 5. The dielectric heating and thawing device 200 processes (e.g., heating, thawing) an object A to be heated (an object to be thawed) such as food by applying a high-frequency electric field. As shown in FIG. 5, the main constituting members of the dielectric heating and thawing device 200 include a casing 201, a cooking chamber 202, a control unit 209, and a high-frequency power source 210.

The high-frequency power source 210 includes a first semiconductor amplification circuit (amplifier) 3, a second semiconductor amplification circuit (amplifier) 4, a high-frequency generation unit 206, top electrode (power supply unit, electrode) 251, a bottom electrode (power supply unit, electrode) 252, and a matching circuit 254.

The casing 201 defines the outer shape of the dielectric heating and thawing device 200. The cooking chamber 202 is formed as a metallic casing. An object A to be heated such as food is placed in the cooking chamber 202. Inside the cooking chamber 202 are disposed the top electrode 251, the bottom electrode 252, and a ceramic plate 253, among others. The bottom electrode 252 is disposed underneath the ceramic plate 253. The bottom electrode 252 is grounded, and the potential is zero.

The high-frequency power source 210 applies a high-frequency electric field between the top electrode 251 and the bottom electrode 252, as will be described later. The object A to be heated is placed between the top electrode 251 and the bottom electrode 252. In this state, the object A to be heated, which is a dielectric, is dielectrically heated between the electrodes 251 and 252 by applying a high-frequency high voltage between these electrodes. The object A to be heated is heated or thawed through dielectric loss.

The control unit 209 is connected to the constituting components of the dielectric heating and thawing device 200, and controls these members. Examples of the control by the control unit 209 include adjusting high-frequency power, and ending heating.

Configuration of High-Frequency Power Source

Figure 6:
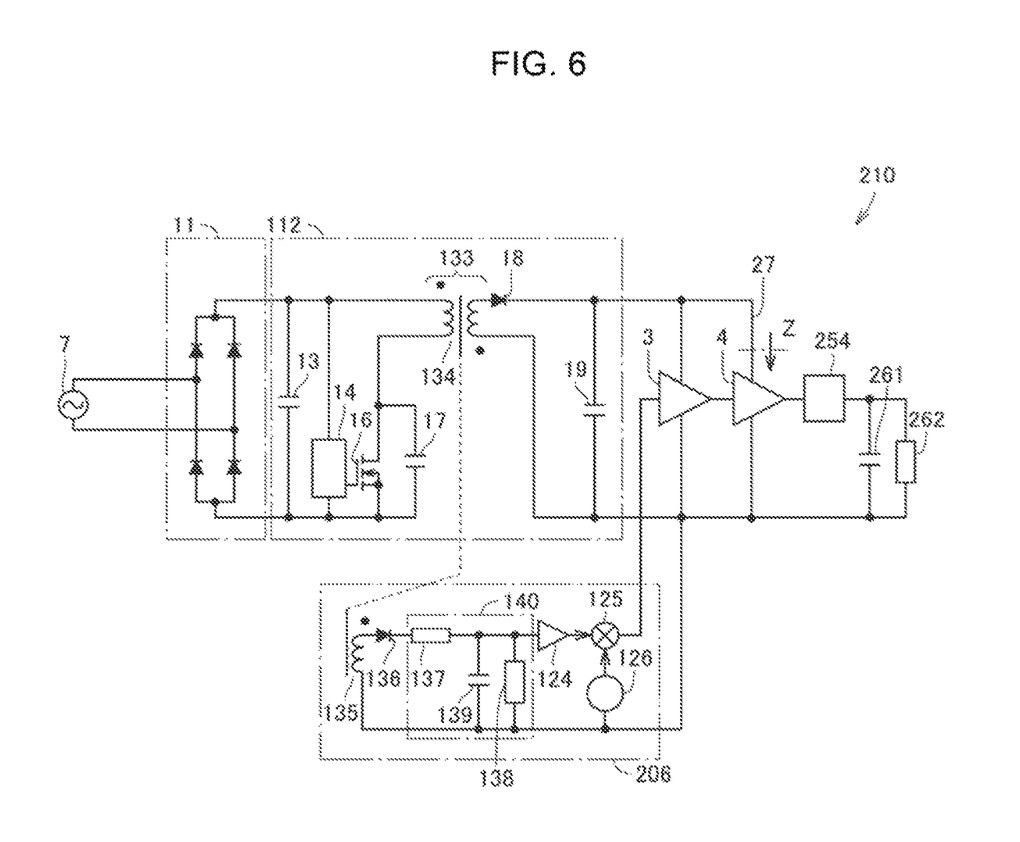
FIG. 6 is a circuit diagram showing a circuit structure of a high-frequency power source of the dielectric heating and thawing device shown in FIG. 5.

The following describes the configuration inside the high-frequency power source 210 of the dielectric heating and thawing device 200, with reference to FIG. 6. FIG. 6 shows a circuit structure of the high-frequency power source 210. The main constituting members of the high-frequency power source 210 include a first semiconductor amplification circuit 3, a second semiconductor amplification circuit 4, a high-frequency generation unit 206, a commercial power source (alternating current power source) 7, a full-wave rectification circuit 11, a switching converter 112, and a matching circuit 254.

In the high-frequency power source 210, the high-frequency generation unit 206 generates a high-frequency signal of, for example, 40.68 MHz. The high-frequency signal is amplified by the first semiconductor amplification circuit 3 and the second semiconductor amplification circuit 4, and the matching circuit 254 matches the impedance. The high-frequency power provided by the high-frequency signal is applied to an equivalent capacitor 261 configured from the top electrode 53 and the bottom electrode 55, and to an equivalent resistor 262 configured by the object A to be heated. This forms a high-frequency electric field between the top electrode 53 and the bottom electrode 55, and a high-frequency power is applied to the object A to be heated placed between the top electrode 53 and the bottom electrode 55.

The high-frequency generation unit 206, the commercial power source (alternating current power source) 7, the full-wave rectification circuit 11, and the switching converter 112 in the high-frequency power source 210 may have the same configurations as those described in Second Embodiment. However, because of the different frequency band from Second Embodiment, the inner configurations of the first semiconductor amplification circuit 3 and the second semiconductor amplification circuit 4 are different from those described in Second Embodiment. The first semiconductor amplification circuit 3 and the second semiconductor amplification circuit 4 of the present embodiment have configurations suited for the VHF band frequencies.

The output high-frequency power from the high-frequency power source 210 can be controlled in the same manner as in Second Embodiment. That is, the method described in First Embodiment with reference to FIG. 3 and formulae (1) and (2) is also applicable.

With the foregoing configuration, the high-frequency generation unit 206 of Third Embodiment can modulate the amplitude of a high-frequency signal with a signal wave that is in synchronism with a half-period of the cycle of the commercial power source 7. Accordingly, in the dielectric heating and thawing device 200 of the present embodiment, the power consumption in the amplification circuits 3 and 4 disposed in the following stage of the switching converter 112 can follow the power sent to the secondary side of the switching converter 112, while improving the input power factor of the commercial power source 7 on the primary side of the switching converter 112.

The embodiments disclosed herein are to be considered in all aspects only as illustrative and not restrictive. The scope of the present invention is to be determined by the scope of the appended claims, not by the foregoing descriptions, and the invention is intended to cover all modifications falling within the equivalent meaning and scope of the claims set forth below. A configuration based on a combination of different configurations of the embodiments described in this specification is also intended to fall within the scope of the present invention.

REFERENCE SIGNS LIST

1: Microwave heating cooker (high-frequency heating device)
2: Cooking chamber
3: First semiconductor amplification circuit (amplifier)
4: Second semiconductor amplification circuit (amplifier)
5: Antenna (power supply unit)
6: High-frequency generation unit
7: Commercial power source (alternating current power source)
10: High-frequency power source
11: First full-wave rectification circuit 11 (first rectification circuit)
12: Switching converter
20: Commercial transformer (power converter)
21: Second full-wave rectification circuit (second rectification circuit)
25: Analog multiplier (amplitude modulation unit)
26: High-frequency oscillator (oscillator)
27: Power supply terminal
100: Microwave heating cooker (high-frequency heating device)
110: High-frequency power source
112: Switching converter
133: Transformer (power converter)
135: Auxiliary coil
200: Dielectric heating and thawing device (high-frequency heating device)
210: High-frequency power source
251: Top electrode (power supply unit, electrode)
252: Bottom electrode (power supply unit, electrode)

The invention claimed is:

1. A high-frequency heating device comprising:
an alternating current power source that supplies power;
an oscillator that generates a high-frequency signal;
an amplitude modulation unit that modulates an amplitude of the high-frequency signal with a signal wave that is in synchronism with a half-period of a cycle of the alternating current power source so as to generate an amplitude-modulated high-frequency signal;
at least one amplifier that amplifies the amplitude-modulated high-frequency signal generated by the amplitude modulation unit;
a power supply unit by which high-frequency power obtained from the amplitude-modulated high-frequency signal amplified by the at least one amplifier is supplied to an object to be heated, and
a switching converter having a controller, a field effect transistor, and a transformer disposed between the alternating current power source and the at least one amplifier,
wherein the controller controls the field effect transistor so that power consumption in a secondary side of the transformer follows power consumption in a primary side of the transformer.

2. The high-frequency heating device according to claim 1, wherein the signal wave that is in synchronism with the half-period of the cycle of the alternating current power source has a waveform produced by full-wave rectification of a voltage of the alternating current power source.

3. The high-frequency heating device according to claim 1, wherein:
the high-frequency power has a frequency in a UHF band, and
the power supply unit has an antenna that radiates the high-frequency power against the object to be heated.

4. The high-frequency heating device according to claim 1, wherein:
the high-frequency power has a frequency in an HF band or in a VHF band,
the power supply unit has at least two electrodes, and the object to be heated is placed between said at least two electrodes, and
the high-frequency power forms a high-frequency electric field between said at least two electrodes.

5. The high-frequency heating device according to claim 1, which further comprises:
a first rectification circuit connected to the alternating current power source, and that rectifies a current supplied to a power supply terminal of the at least one amplifier; and
a second rectification circuit connected to the alternating current power source via a power converter,
wherein the signal wave that is in synchronism with the half-period of the cycle of the alternating current power source is generated by the second rectification circuit.

6. The high-frequency heating device according to claim 1, which further comprises a rectification circuit between the alternating current power source and the at least one amplifier,
wherein the switching converter has an auxiliary coil provided for the transformer, and
wherein the signal wave that is in synchronism with the half-period of the cycle of the alternating current power source is obtained from the auxiliary coil.

7. The high-frequency heating device according to claim 1, wherein the power consumption in the secondary side of the transformer is controlled by the at least one amplifier by changing a peak current value of alternating current power source and a peak value of the signal wave that is in synchronism with the half-period of the cycle of the alternating current power source having a waveform produced by full-wave rectification of a voltage of the alternating current power source.

8. The high-frequency heating device according to claim 1, wherein a magnitude of the amplitude-modulated high-frequency signal is controlled so that the power consumption in the secondary side follows the power consumption in the primary side.

9. The high-frequency heating device according to claim 1, wherein a plurality of the amplifiers is present, and energy storage in the secondary side is reduced by a voltage to power terminals of the plurality of amplifiers to vary.

* * * * *